(12) United States Patent
Yang et al.

(10) Patent No.: US 9,831,860 B2
(45) Date of Patent: Nov. 28, 2017

(54) CLOCK GENERATION CIRCUIT

(71) Applicant: TAIWAN SEMICONDUCTOR MANUFACTURING COMPANY, LTD., Hsinchu (TW)

(72) Inventors: Tien-Chun Yang, San Jose, CA (US); Chih-Chang Lin, San Jose, CA (US); Ming-Chieh Huang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/003,330

(22) Filed: Jan. 21, 2016

(65) Prior Publication Data

US 2016/0277014 A1    Sep. 22, 2016

Related U.S. Application Data

(60) Provisional application No. 62/133,924, filed on Mar. 16, 2015.

(51) Int. Cl.
*H03K 3/00* (2006.01)
*H03K 5/151* (2006.01)

(52) U.S. Cl.
CPC .................. *H03K 5/1515* (2013.01)

(58) Field of Classification Search
CPC .................................. H03K 5/1515
USPC ....................................... 327/295
See application file for complete search history.

(56) References Cited

U.S. PATENT DOCUMENTS

| | | | | |
|---|---|---|---|---|
| 5,444,405 A | * | 8/1995 | Truong | H03K 5/1515 327/239 |
| 6,073,246 A | * | 6/2000 | Song | G06F 1/10 713/401 |
| 6,900,682 B2 | * | 5/2005 | Truong | H03K 5/1515 327/239 |
| 2009/0091399 A1 | * | 4/2009 | Wong | H03K 3/017 331/57 |
| 2015/0097621 A1 | * | 4/2015 | Morris | H03F 1/086 330/253 |

OTHER PUBLICATIONS

Office Action dated Nov. 21, 2016 from corresponding application No. TW 105108128.

* cited by examiner

*Primary Examiner* — Lincoln Donovan
*Assistant Examiner* — Metasebia Retebo
(74) *Attorney, Agent, or Firm* — Hauptman Ham, LLP

(57) ABSTRACT

A clock generation circuit includes a two-phase non-overlapping clock generation circuit, an inverter, and a delay circuit. The two-phase non-overlapping clock generation circuit is configured to generate a first phase clock signal and a second phase clock signal based on a non-inverted clock signal and an inverted clock signal. The first phase clock signal and the second phase clock signal correspond to a same logical value during a first duration and a second duration within a clock cycle. The inverter is configured to generate the inverted clock signal based on an input clock signal. The delay circuit is configured to generate the non-inverted clock signal based on the input clock signal. The delay circuit has a predetermined delay sufficient to cause a difference between the first duration and the second duration to be less than a predetermined tolerance.

20 Claims, 9 Drawing Sheets

CLOCK GENERATION CIRCUIT

BACKGROUND

A pair of two-phase non-overlapping clock signals includes two clock signals that do not concurrently have a predetermined logical value. Non-overlapping clock signals have been used in many circuit applications, such as a charge pump, a filter, or an amplifier having switched-capacitor configurations, or other applications. In many applications, a pair of two-phase non-overlapping clock signals is generated based on processing a single input clock signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
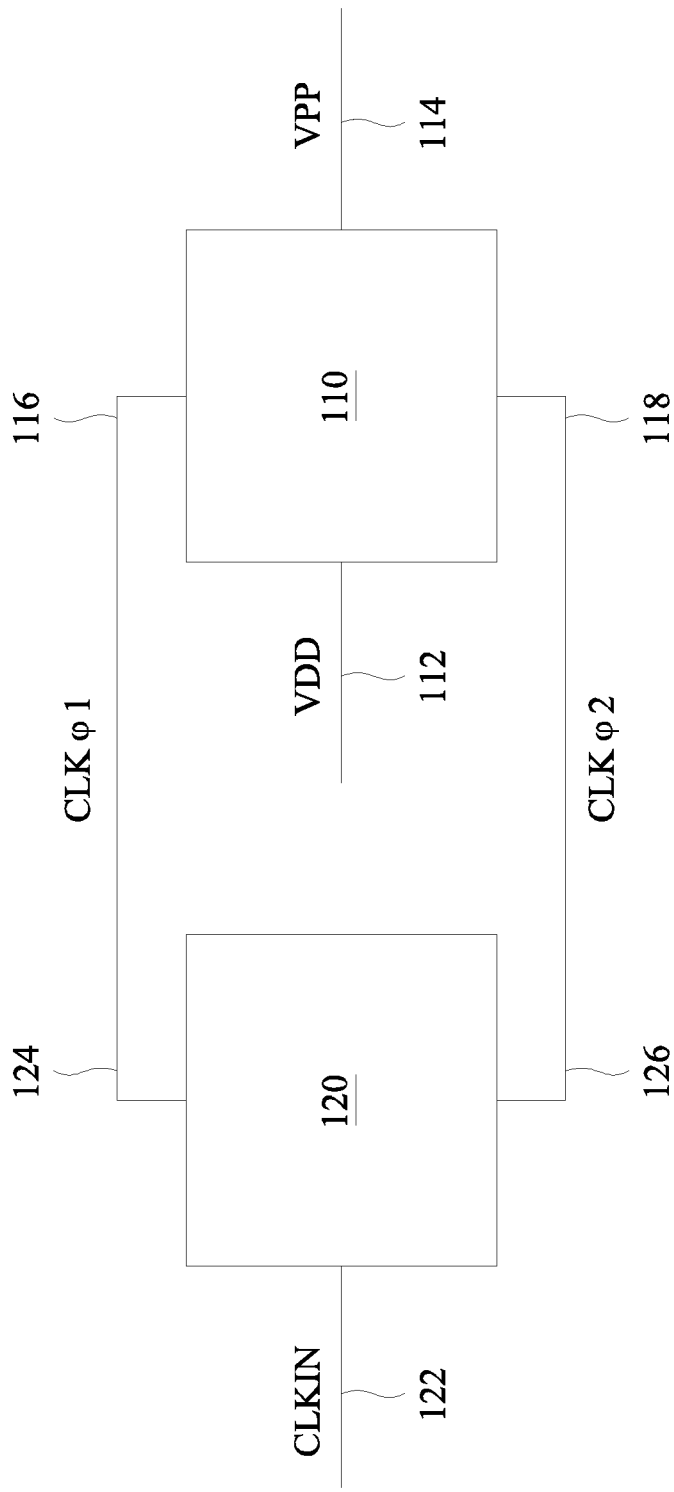
FIG. 1A is a functional block diagram of a charge pump and a clock generation circuit illustrating an application of a pair of two-phase non-overlapping clock signals, in accordance with one or more embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments of the present disclosure, a delay circuit and an inverter are used to generate a non-inverted clock signal and an inverted clock signal based on the same clock input signal. A two-phase non-overlapping clock generation circuit generates two non-overlapping clock signals based on the non-inverted clock signal and the inverted clock signal. In accordance with some embodiments of the present disclosure, a delay of the delay circuit is set to improve the symmetry of the waveforms of the generated non-overlapping clock signals.

FIG. 1A is a functional block diagram of a charge pump 110 and a clock generation circuit 120 illustrating an application of a pair of two-phase non-overlapping clock signals CLKφ1 and CLKφ2 in accordance with one or more embodiments.

Charge pump 110 includes a supply voltage node 112, a pumped voltage node 114, a first clock input node 116, and a second clock input node 118. Charge pump 110 is configured to generate a pumped voltage VPP at pumped voltage node 114 based on the energy provided from supply voltage VDD at supply voltage node 112 and controlled by clock signal CLKφ1 at first clock input node 116 and clock signal CLKφ2 at second clock input node 118.

Clock generation circuit 120 includes an input clock node 122, a first output clock node 124, and a second output clock node 126. Clock generation circuit 120 is configured to generate clock signal CLKφ1 at first output clock node 124 and clock signal CLKφ2 at second output clock node 126 based on an input clock signal CLKIN. First output clock node 124 is electrically coupled with first clock input node 116, and second output clock node 126 is electrically coupled with second clock input node 118. In some embodiments, input clock signal CLKIN has a predetermined frequency and a corresponding period, which is an inverse of the predetermined frequency. In some embodiments, clock signals CLKφ1 and CLKφ2 also have the predetermined frequency.

Figure 1B:
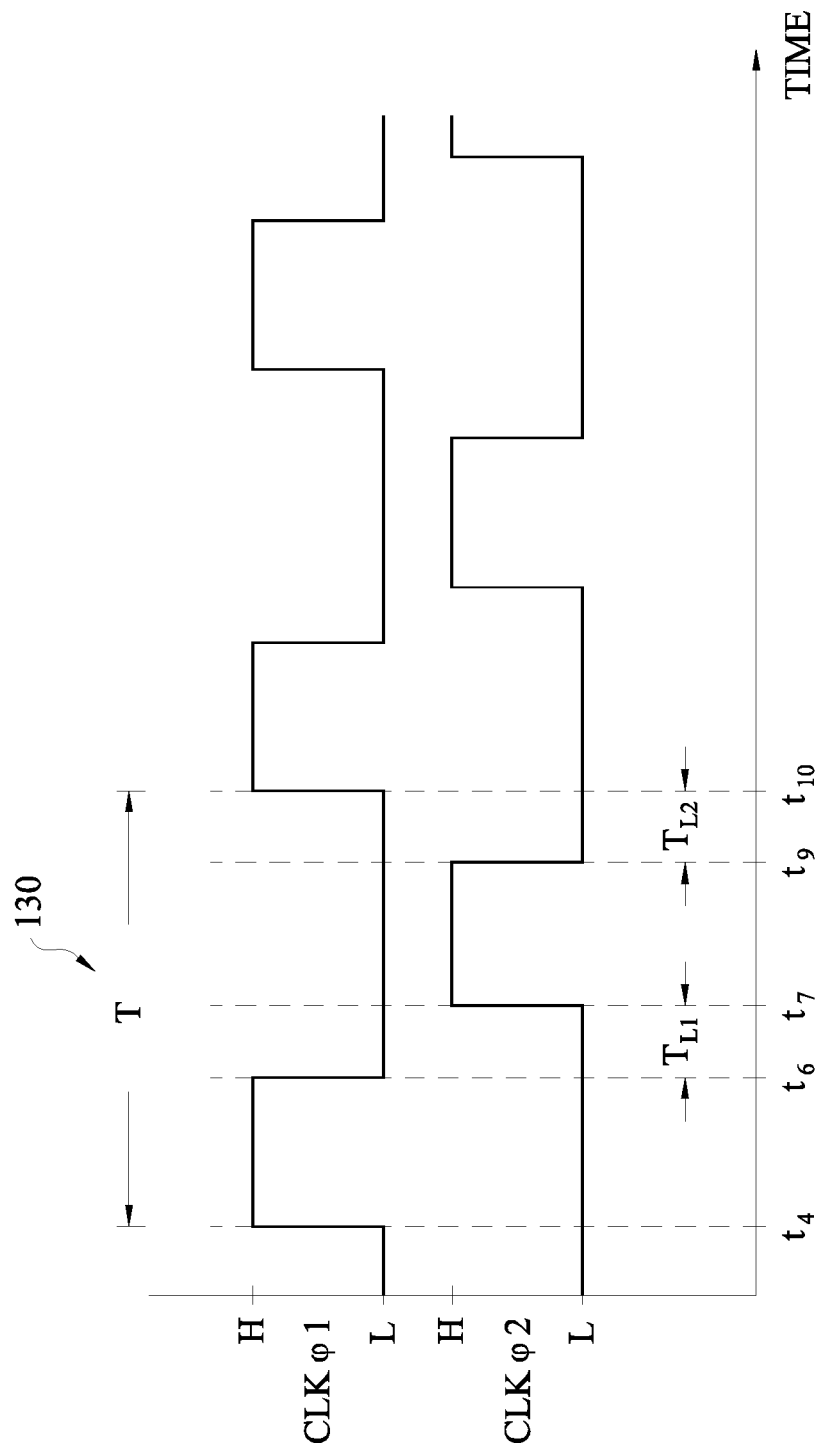
FIG. 1B is a timing diagram of the pair of two-phase non-overlapping clock signals in FIG. 1A, in accordance with one or more embodiments.

FIG. 1B is a timing diagram of the pair of two-phase non-overlapping clock signals CLKφ1 and CLKφ2 in FIG. 1A in accordance with one or more embodiments. During a clock cycle 130 from time t4 to time t10, clock signal CLKφ1 is at a logic high from time t4 to time t6 and at a logic low from time t6 to time t10; and clock signal CLKφ2 is at a logic high from time t7 to time t9 and at a logic low from time t4 to time t7 and from time t9 to time t10. Clock cycle 130 has a duration T that equals the inverse of the predetermined frequency of input clock signal CLKIN.

During the clock cycle 130, the portion that clock signal CLKφ1 is at logic high does not overlap the portion that clock signal CLKφ2 is at logic high. During the clock cycle 130, clock signals CLKφ1 and CLKφ2 are both logically low from time t6 to t7 and having a duration $T_{L1}$ and are both logically low from time t9 to t10 and having a duration $T_{L2}$. In some embodiments, a difference between duration $T_{L1}$ and duration $T_{L2}$ is usable to measure the symmetry between clock signals CLKφ1 and CLKφ2. The smaller the difference between duration $T_{L1}$ and duration $T_{L2}$, the more symmetry there is between clock signals CLKφ1 and CLKφ2. In some embodiments, the more symmetry between clock signals CLKφ1 and CLKφ2, the better the power conversion efficiency of charge pump 110.

Figure 2A:
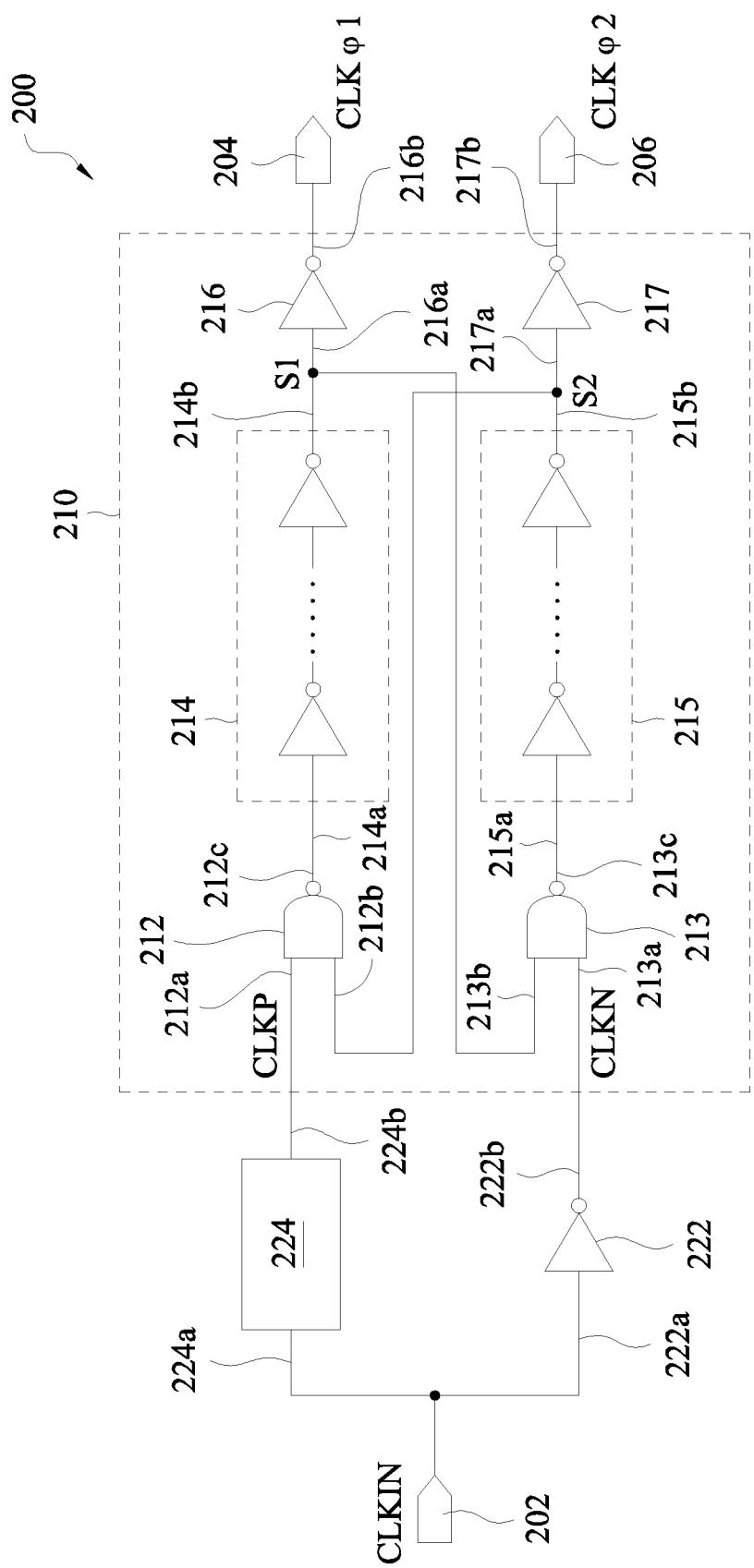
FIG. 2A is a schematic diagram of an example clock generation circuit usable in the circuit depicted in FIG. 1A, in accordance with one or more embodiments.

FIG. 2A is a schematic diagram of an example clock generation circuit 200 usable in the circuit depicted in FIG. 1A in accordance with one or more embodiments. Components that are the same or similar to those in FIG. 1A are given the same reference numbers, and detailed description thereof is thus omitted.

Clock generation circuit 200 includes an input clock node 202, a first output clock node 204, and a second output clock node 206. Input clock node 202 corresponds to input clock node 122 and is configured to receive input clock signal CLKIN. First output clock node 204 corresponds to first output clock node 124 and is configured to output a first phase clock signal CLKφ1. Second output clock node 206 corresponds to second output clock node 126 and is configured to output a second phase clock signal CLKφ2.

Clock generation circuit 200 further includes a two-phase non-overlapping clock generation circuit 210, a first inverter 222, and a first delay circuit 224. Two-phase non-overlapping clock generation circuit 210 is configured to generate first phase clock signal CLKφ1 and second phase clock signal CLKφ2 based on a non-inverted clock signal CLKP and an inverted clock signal CLKN. Inverter 222 is configured to generate inverted clock signal CLKN based on input clock signal CLKIN. Delay circuit 224 is configured to generate the non-inverted clock signal CLKP based on input clock signal CLKIN. In some embodiments, input clock signal CLKIN has a predetermined frequency Freq (not shown).

Inverter 222 is configured to cause a phase-inverted delay $D_N$ (FIG. 2B) between the output terminal 222b of inverter 222 and input terminal 222a of inverter 222. Delay circuit 224 is configured to cause a non-phase-inverted delay $D_P$ (FIG. 2B) between output terminal 224b of delay circuit 224 and input terminal 224a of delay circuit 224. In some embodiments, a difference between the phase-inverted delay $D_N$ and the non-phase-inverted delay $D_P$ is within a first predetermined tolerance. In some embodiments, the first predetermined tolerance is 1.0% of an inverse of the predetermined frequency Freq.

Two-phase non-overlapping clock generation circuit 210 includes NAND gates 212 and 213, delay circuits 214 and 215, and inverters 216 and 217. NAND gate 212 includes a first input terminal 212a, a second input terminal 212b, and an output terminal 212c. NAND gate 213 includes a first input terminal 213a, a second input terminal 213b, and an output terminal 213c. Delay circuit 214 includes an input terminal 214a and an output terminal 214b. Delay circuit 215 includes an input terminal 215a and an output terminal 215b. Inverter 216 includes an input terminal 216a and an output terminal 216b. Inverter 217 includes an input terminal 217a and an output terminal 217b.

First input terminal 212a of NAND gate 212 is configured to receive non-inverted clock signal CLKP. Output terminal 212c of NAND gate 212 is electrically coupled with input terminal 214a of delay circuit 214. Delay circuit 214 is configured to generate a signal S1 at output terminal 214b of delay circuit 214. Input terminal 216a of inverter 216 is electrically coupled with output terminal 214b of delay circuit 214. Output terminal 216b of inverter 216 is electrically coupled with first output clock node 204.

First input terminal 213a of NAND gate 213 is configured to receive inverted clock signal CLKN. Output terminal 213c of NAND gate 213 is electrically coupled with input terminal 215a of delay circuit 215. Delay circuit 215 is configured to generate a signal S2 at output terminal 215b of delay circuit 215. Input terminal 217a of inverter 217 is electrically coupled with output terminal 215b of delay circuit 215. Output terminal 217b of inverter 217 is electrically coupled with second output clock node 206.

Second input terminal 212b of NAND gate 212 is electrically coupled with output terminal 215b of delay circuit 215 and is configured to receive signal S2. Second input terminal 213b of NAND gate 213 is electrically coupled with output terminal 214b of delay circuit 214 and is configured to receive signal S1.

Delay circuit 214 includes 2N inverters electrically coupled in series between input terminal 214a and output terminal 214b. Delay circuit 215 includes 2N inverters electrically coupled in series between input terminal 215a and output terminal 215b. N is a positive, non-zero integer.

Moreover, inverter 222 includes an input terminal 222a and an output terminal 222b, and delay circuit 224 includes an input terminal 224a and an output terminal 224b. Input terminal 222a of inverter 222 and input terminal 224a of delay circuit 224 are electrically coupled with input clock node 202. Output terminal 224b of delay circuit 224 is electrically coupled with first input terminal 212a of NAND gate 212. Output terminal 222b of inverter 222 is electrically coupled with first input terminal 213a of NAND gate 213.

Figure 2B:
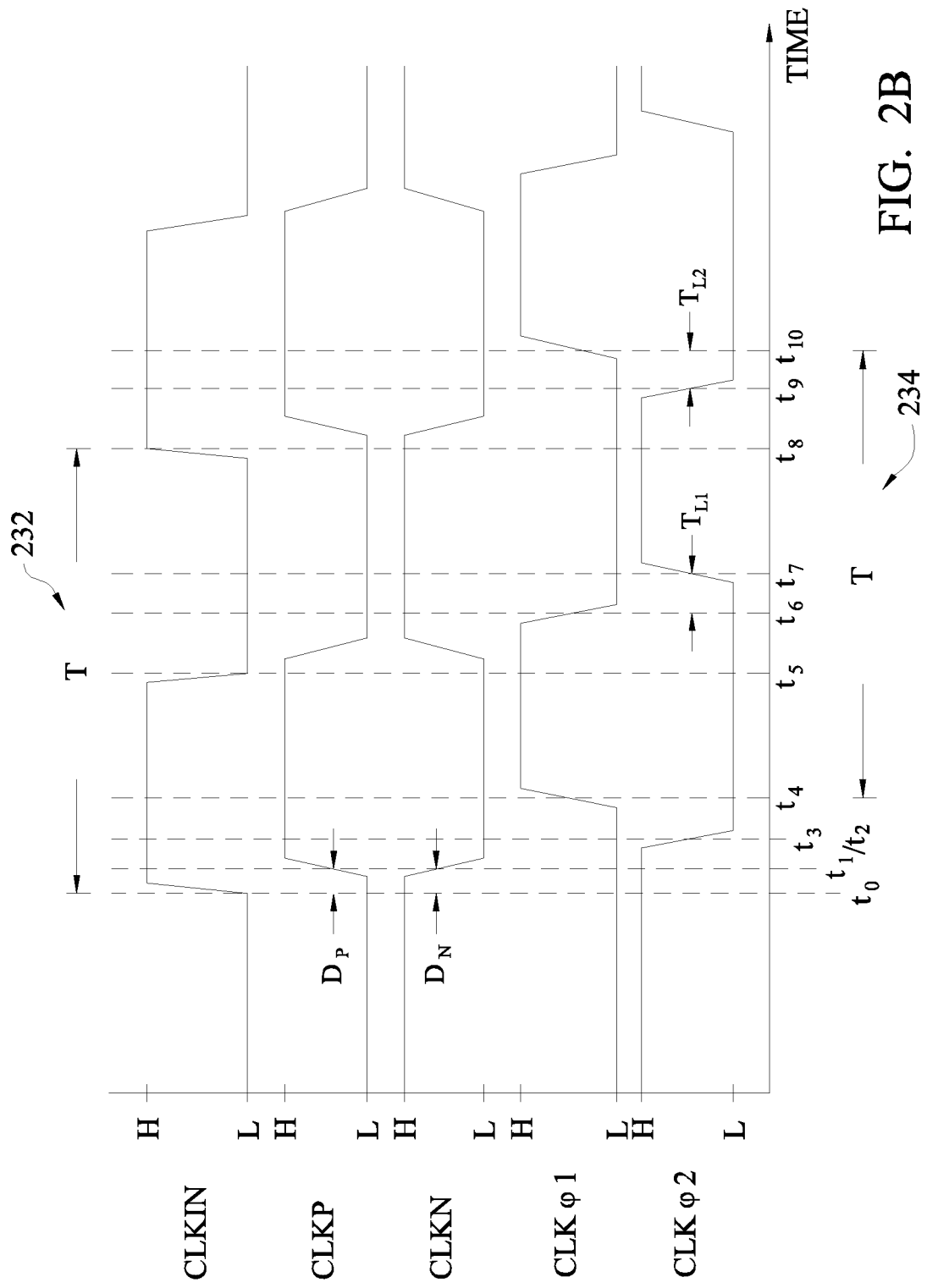
FIG. 2B is a timing diagram of various signals in the clock generation circuit in FIG. 2A, in accordance with one or more embodiments.

FIG. 2B is a timing diagram of various signals, including signals CLKIN, CLKP, CLKN, CLKφ1, and CLKφ2, in the clock generation circuit 200 in FIG. 2A in accordance with one or more embodiments.

In some embodiments, input clock signal CLKIN has a predetermined frequency Freq (not shown). An inverse of the predetermined frequency Freq is a time duration T of a clock cycle period of input clock signal CLKIN.

At time t0, clock signal CLKIN transitions from logically low to logically high. In response to the transition of clock signal CLKIN at time t0, at time t1, delay circuit 224 causes non-inverted clock signal CLKP to transition from logically low to logically high. Also, in response to the transition of clock signal CLKIN at time t0, at time t2, inverter 222 causes inverted clock signal CLKN to transition from logically high to logically low. Delay circuit 224 causes a non-phase-inverted delay $D_P$ between time t1 and time t0. Inverter 222 causes a phase-inverted delay $D_N$ between time t2 and time t0. In some embodiments, a difference between the phase-inverted delay $D_N$ and the non-phase-inverted delay $D_P$ is within a first predetermined tolerance. In some embodiments, predetermined tolerance is 1.0 of T, the inverse of the predetermined frequency Freq.

At time t3, in response to the rising edge of signal CLKP at time t1 and the falling edge of signal CLKN at time t2, two-phase non-overlapping clock generation circuit 210 causes clock signal CLKφ2 to transition from logically high to logically low. Also, at time t4, in response to the rising edge of signal CLKP at time t1 and the falling edge of signal CLKN at time t2, two-phase non-overlapping clock generation circuit 210 causes clock signal CLKφ1 to transition from logically low to logically high.

At time t5, clock signal CLKIN transitions from logically high to logically low. In response to the transition of clock signal CLKIN at time t5, delay circuit 224 causes non-inverted clock signal CLKP to transition from logically high to logically low. Also, in response to the transition of clock signal CLKIN at time t5, inverter 222 causes inverted clock signal CLKN to transition from logically low to logically high. At time t6, two-phase non-overlapping clock generation circuit 210 then causes clock signal CLKφ1 to transition from logically high to logically low. Also, at time t7, two-phase non-overlapping clock generation circuit 210 then causes clock signal CLKφ2 to transition from logically low to logically high.

At time t8, clock signal CLKIN transitions from logically low to logically high. In response to the transition of clock signal CLKIN at time t8, delay circuit 224 causes non-inverted clock signal CLKP to transition from logically low to logically high. Also, in response to the transition of clock signal CLKIN at time t8, inverter 222 causes inverted clock signal CLKN to transition from logically high to logically low. At time t9, two-phase non-overlapping clock generation circuit 210 then causes clock signal CLKφ2 to transition from logically high to logically low. Also, at time t10, two-phase non-overlapping clock generation circuit 210 then causes clock signal CLKφ1 to transition from logically low to logically high.

In response to a clock cycle 232 from time t0 to time t8, clock signals CLKφ1 and CLKφ2 form a clock cycle 234 from time t4 to time t10. Clock cycle 232 has a time duration T, and clock cycle 234 has the same time duration T. During the clock cycle 234, clock signals CLKφ1 and CLKφ2 are both logically low from time t6 to t7 and having a duration $T_{L1}$ and are both logically low from time t9 to t10 and having a duration $T_{L2}$. In some embodiments, a difference between duration $T_{L1}$ and duration $T_{L2}$ is usable to measure the symmetry between clock signals CLKφ1 and CLKφ2. In some embodiments, delay circuit 224 is configured to have a predetermined delay $D_P$ sufficient to cause a difference between duration $T_{L1}$ and duration $T_{L2}$ to be less than a predetermined tolerance. In some embodiments, the predetermined tolerance between duration $T_{L1}$ and duration $T_{L2}$ is 1.0% of T, which is the inverse of the predetermined frequency Freq.

Figure 3A:
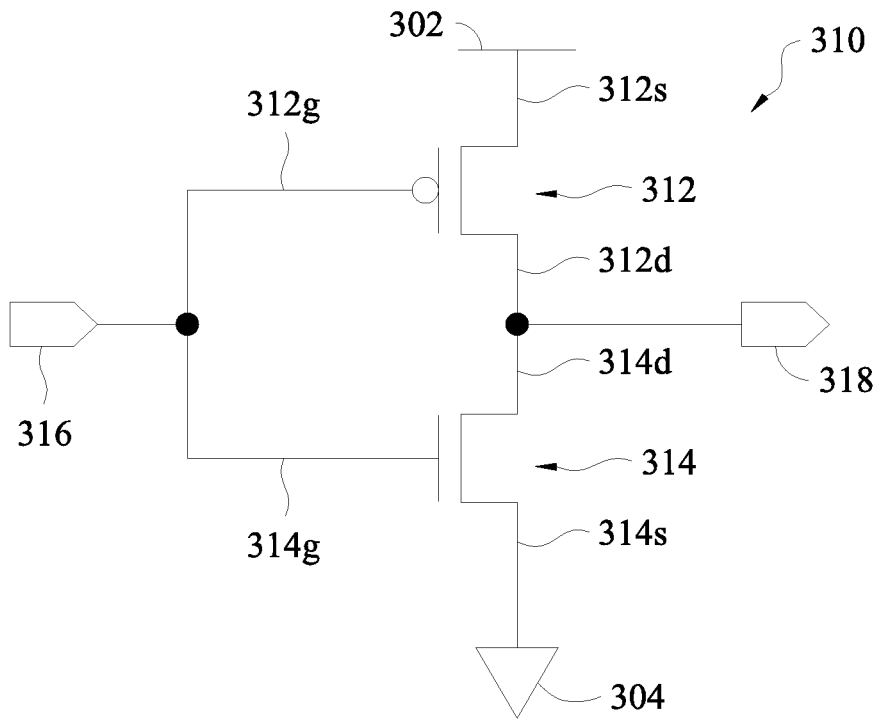
FIG. 3A is a schematic diagram of an inverter usable in a clock generation circuit, such as the clock generation circuit depicted in FIG. 2A, in accordance with one or more embodiments.

FIG. 3A is a schematic diagram an inverter 310 usable in a clock generation circuit, such the clock generation circuit 200 depicted in FIG. 2A, in accordance with one or more embodiments.

Inverter 310 includes a P-type transistor 312 and an N-type transistor 314 electrically coupled in series between a power node 302 and a reference node 304. Power node 302 is configured to carry a supply voltage VDD, and reference node 304 is configured to carry a reference voltage VSS. A gate 312g of transistor 312 and a gate 314g of transistor 314 are electrically coupled with an input terminal 316 of inverter 310. A drain 312d of transistor 312 and a drain 314d of transistor 314 are electrically coupled with output terminal 318 of inverter 310. A source 312s of transistor 312 is electrically coupled with power node 302. A source 314s of transistor 314 is electrically coupled with reference node 304. In some embodiments, input terminal 316 corresponds to input terminal 222a in FIG. 2A, and output terminal 318 corresponds to output terminal 222b.

In some embodiments, P-type transistor 312 has a first channel width versus channel length (W/L) ratio. In some embodiments, N-type transistor 314 has a second W/L ratio.

Figure 3B:
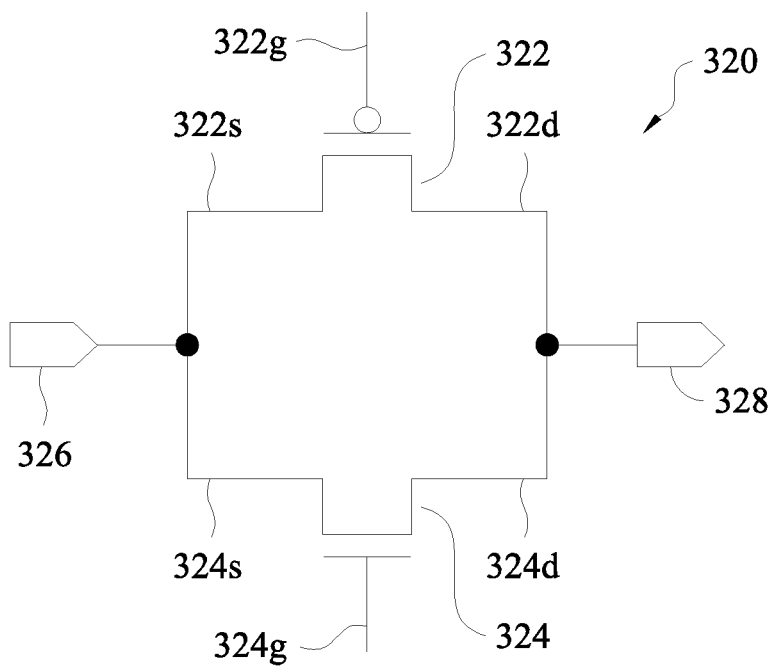
FIGS. 3B-3D are schematic diagrams of various example delay circuit usable in a clock generation circuit, such the clock generation circuit depicted in FIG. 2A, in accordance with one or more embodiments.

FIG. 3B is a schematic diagram an example delay circuit 320 usable in a clock generation circuit, such the clock generation circuit 200 depicted in FIG. 2A, in accordance with one or more embodiments.

Delay circuit 320 includes a P-type transistor 322 and an N-type transistor 324 electrically coupled in parallel between an input terminal 326 of delay circuit 320 and an output terminal 328 of delay circuit 320. In some embodiments, input terminal 326 corresponds to input terminal 224a in FIG. 2A, and output terminal 328 corresponds to output terminal 224b. A drain 322d of transistor 322 and a drain 324d of transistor 324 are electrically coupled with output terminal 328 of delay circuit 320. A source 322s of transistor 322 and a source 324s of transistor 324 are electrically coupled with input terminal 326 of delay circuit 320. In some embodiments, the placement of source 322s and drain 322d is interchangeable. In some embodiments, the placement of source 324s and drain 324d is interchangeable.

A gate 322g of P-type transistor 322 is configured to receive a signal sufficient to turn on P-type transistor 322. In some embodiments, gate 322g of P-type transistor 322 is electrically coupled with reference node 304 (FIG. 3A). A gate 324g of N-type transistor 324 is configured to receive a signal sufficient to turn on N-type transistor 324. In some embodiments, gate 324g of N-type transistor 324 is electrically coupled with power node 302 (FIG. 3A).

In some embodiments, P-type transistor 322 has a third W/L ratio. In some embodiments, N-type transistor 324 has a fourth W/L ratio. In some embodiments, third W/L ratio is less than the first W/L ratio of P-type transistor 312. In some embodiments, third W/L ratio is half of the first W/L ratio of P-type transistor 312. In some embodiments, fourth W/L ratio is less than the second W/L ratio of N-type transistor 314. In some embodiments, fourth W/L ratio is half of the second W/L ratio of N-type transistor 314.

Figure 3C:
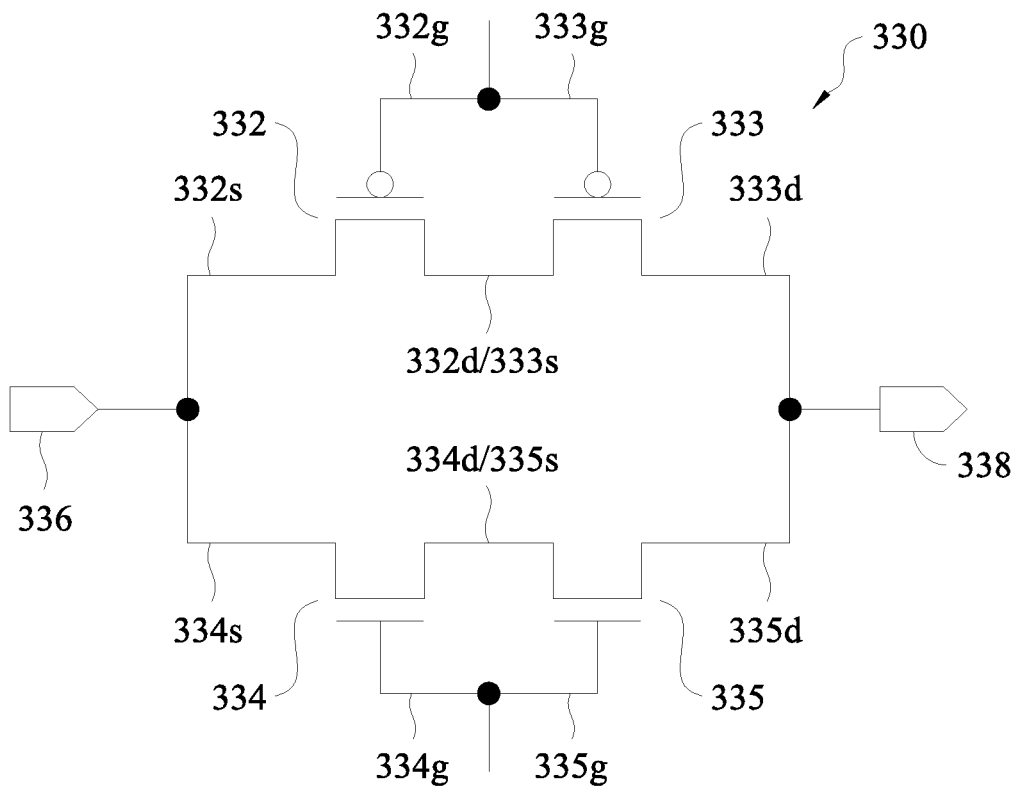

FIG. 3C is a schematic diagram another example delay circuit 330 usable in a clock generation circuit, such the clock generation circuit 200 depicted in FIG. 2A, in accordance with one or more embodiments.

Delay circuit 330 includes P-type transistors 332 and 333 and N-type transistors 334 and 335. P-type transistors 332 and 333 are electrically coupled in series between and an input terminal 336 of delay circuit 330 and an output terminal 338 of delay circuit 330. N-type transistors 334 and 335 are electrically coupled in series between and input terminal 336 of delay circuit 330 and output terminal 338 of delay circuit 330. In some embodiments, input terminal 336 corresponds to input terminal 224a in FIG. 2A, and output terminal 338 corresponds to output terminal 224b.

A source 332s of transistor 332 is electrically coupled with input terminal 326. A drain 332d of transistor 332 is electrically coupled with a source 333s of transistor 333. A drain 333d of transistor 333 is electrically coupled with output terminal 338. A source 334s of transistor 334 is electrically coupled with input terminal 326. A drain 334d of transistor 334 is electrically coupled with a source 335s of transistor 335. A drain 335d of transistor 335 is electrically coupled with output terminal 338. In some embodiments, the placement of source 332s and drain 332d or source 333s and drain 333d is interchangeable. In some embodiments, the placement of source 334s and drain 334d or source 335s and drain 335d is interchangeable.

A gate 332g of P-type transistor 332 and a gate 333g of P-type transistor 333 are configured to receive a signal sufficient to turn on P-type transistors 332 and 333. In some embodiments, gates 332g and 333g of P-type transistors 322 and 333 are electrically coupled with reference node 304 (FIG. 3A). A gate 334g of N-type transistor 334 and a gate 335g of N-type transistor 335 are configured to receive a signal sufficient to turn on N-type transistors 334 and 335.

In some embodiments, gates 334g and 335g of N-type transistors 324 and 335 are electrically coupled with power node 302 (FIG. 3A).

In some embodiments, P-type transistors 332 and 333 has a fifth W/L ratio. In some embodiments, N-type transistors 334 and 335 has a sixth W/L ratio. In some embodiments, fifth W/L ratio is less than the first W/L ratio of P-type transistor 312. In some embodiments, fifth W/L ratio is the same as the first W/L ratio of P-type transistor 312. In some embodiments, sixth W/L ratio is less than the second W/L ratio of N-type transistor 314. In some embodiments, sixth W/L ratio the same as the second W/L ratio of N-type transistor 314.

Figure 3D:
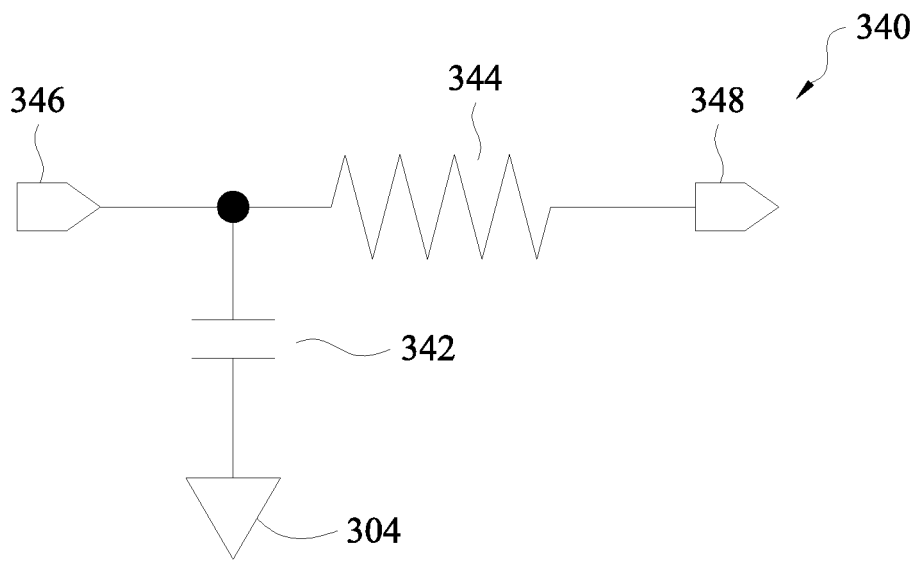

FIG. 3D is a schematic diagram another example delay circuit 340 usable in a clock generation circuit, such the clock generation circuit 200 depicted in FIG. 2A, in accordance with one or more embodiments.

Delay circuit 340 is a resistance-capacitance delay circuit including a capacitive device 342 and a resistive device 344. Capacitive device 342 is electrically coupled between input terminal 346 of delay circuit 340 and reference node 304. Resistive device 344 is electrically coupled between input terminal 346 of delay circuit 340 and an output terminal 348 of delay circuit 340. In some embodiments, input terminal 346 corresponds to input terminal 224a in FIG. 2A, and output terminal 348 corresponds to output terminal 224b.

Figure 4A:
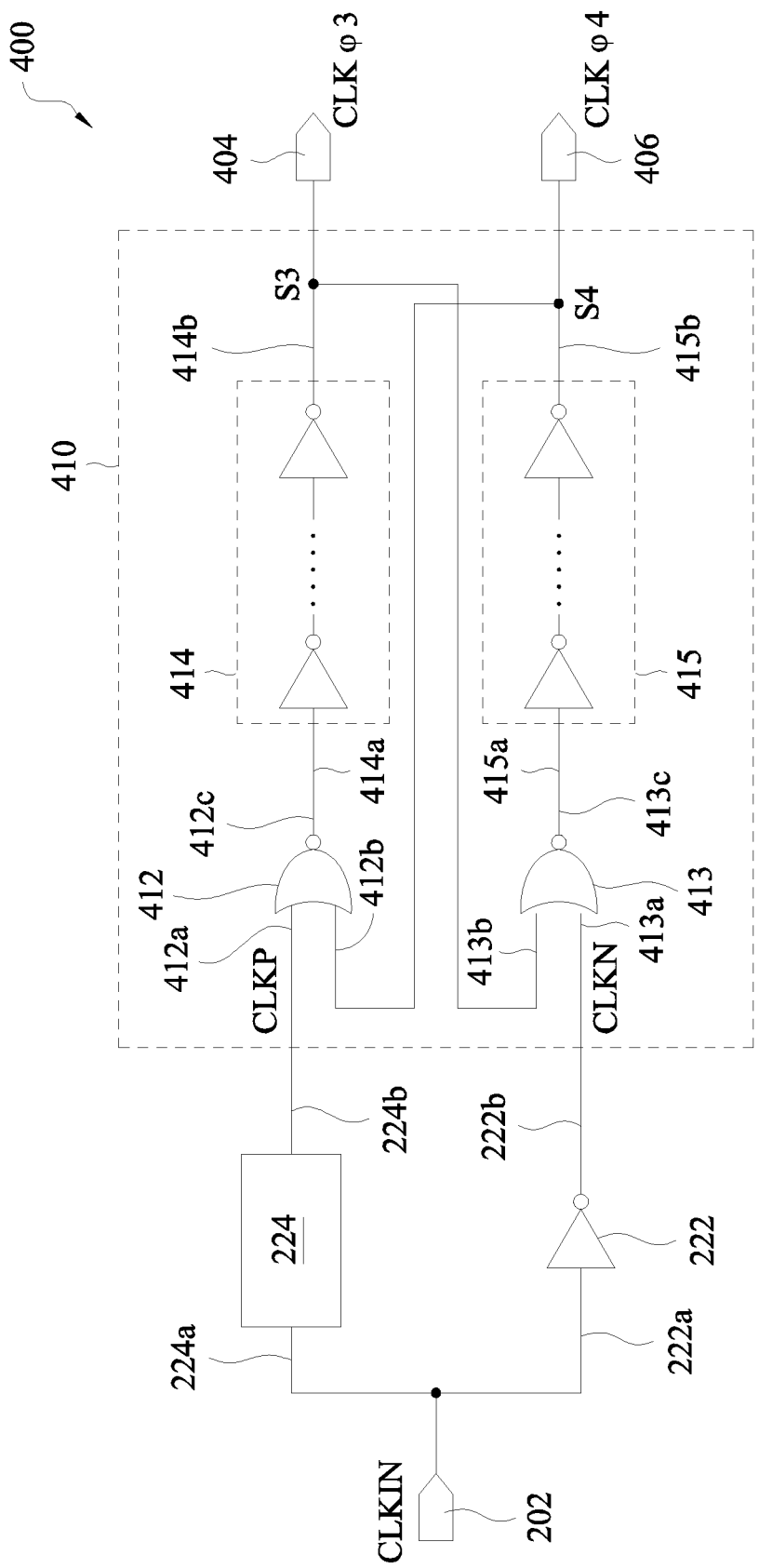
FIG. 4A is a schematic diagram of another example clock generation circuit usable in the circuit depicted in FIG. 1A, in accordance with one or more embodiments.

FIG. 4A is a schematic diagram of another example clock generation circuit 400 usable in the circuit depicted in FIG. 1A in accordance with one or more embodiments. Components in FIG. 4A that are the same or similar to those in FIG. 2A are given the same reference numbers, and detailed description thereof if thus omitted.

Compared with clock generation circuit 200, clock generation circuit 400 replaces two-phase non-overlapping clock generation circuit 210 with two-phase non-overlapping clock generation circuit 410. Clock generation circuit 400 includes a first output clock node 404 and a second output clock node 406. Two-phase non-overlapping clock generation circuit 410 is configured to generate a first phase clock signal CLKφ3 and a second phase clock signal CLKφ4 based on a non-inverted clock signal CLKP and an inverted clock signal CLKN. Signals CLKP and CLKN are generated by delay circuit 224 and inverter 222 based on input clock signal CLKIN. In some embodiments, input clock signal CLKIN has a predetermined frequency Freq (not shown).

Two-phase non-overlapping clock generation circuit 410 includes NOR gates 412 and 413 and delay circuits 414 and 415. NOR gate 412 includes a first input terminal 412a, a second input terminal 412b, and an output terminal 412c. NOR gate 413 includes a first input terminal 413a, a second input terminal 413b, and an output terminal 413c. Delay circuit 414 corresponds to delay circuit 214 and includes an input terminal 414a and an output terminal 414b. Delay circuit 415 corresponds to delay circuit 215 and includes an input terminal 415a and an output terminal 415b.

First input terminal 412a of NOR gate 412 is configured to receive non-inverted clock signal CLKP. Output terminal 412c of NOR gate 412 is electrically coupled with input terminal 414a of delay circuit 414. Delay circuit 414 is configured to generate a signal S3 at output terminal 414b of delay circuit 414. Output terminal 414b is electrically coupled with first output clock node 404.

First input terminal 413a of NOR gate 413 is configured to receive inverted clock signal CLKN. Output terminal 413c of NOR gate 413 is electrically coupled with input terminal 415a of delay circuit 415. Delay circuit 415 is configured to generate a signal S4 at output terminal 415b of delay circuit 415. Output terminal 415b is electrically coupled with second output clock node 406.

Second input terminal 412b of NOR gate 412 is electrically coupled with output terminal 415b of delay circuit 415 and is configured to receive signal S4. Second input terminal 413b of NOR gate 413 is electrically coupled with output terminal 414b of delay circuit 414 and is configured to receive signal S3.

Delay circuit 414 corresponds to delay circuit 214 and includes 2N inverters electrically coupled in series between input terminal 414a and output terminal 414b. Delay circuit 415 corresponds to delay circuit 215 and includes 2N inverters electrically coupled in series between input terminal 415a and output terminal 415b. N is a positive, non-zero integer.

Figure 4B:
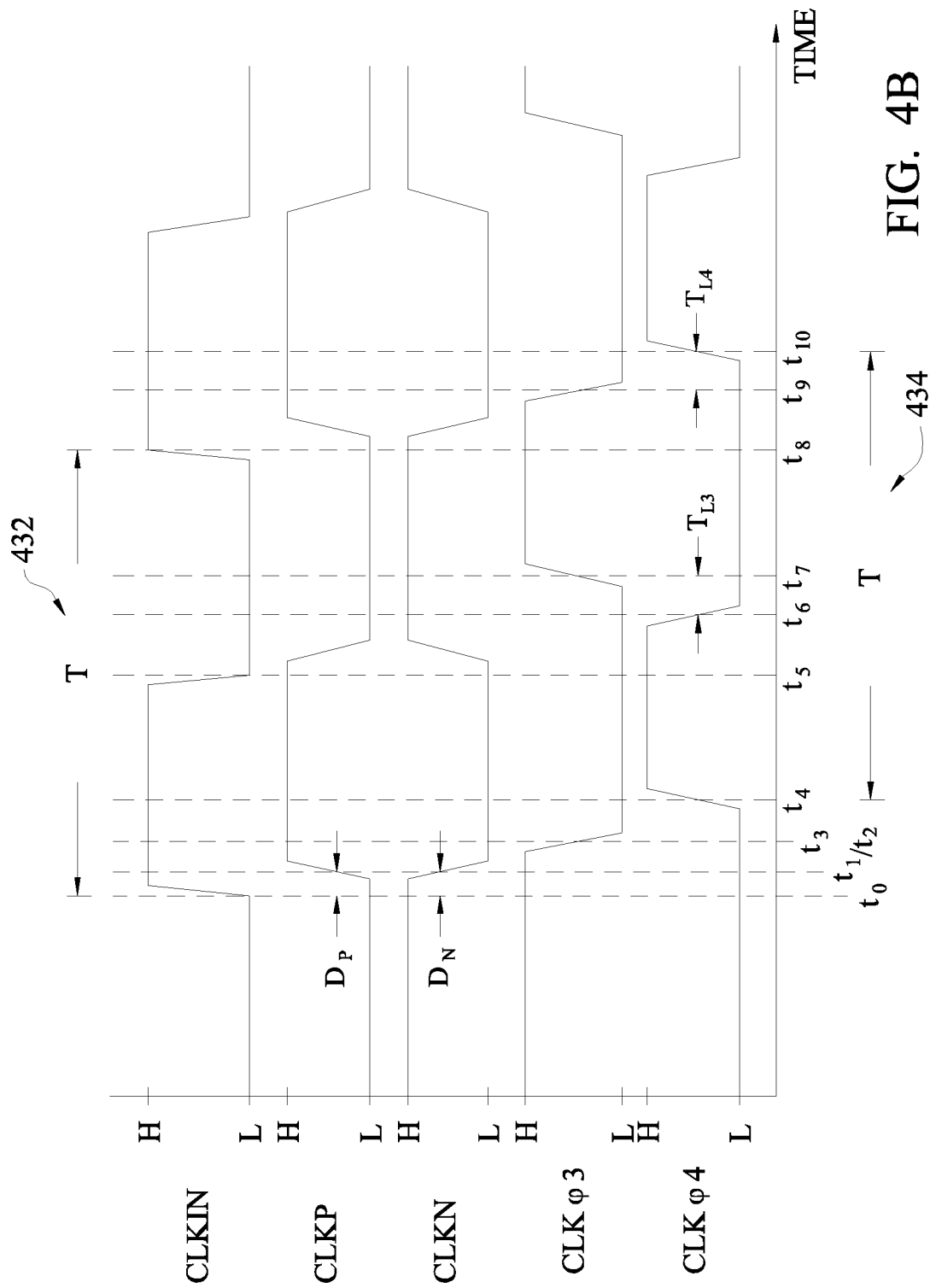
FIG. 4B is a timing diagram of various signals in the clock generation circuit in FIG. 4A, in accordance with one or more embodiments.

FIG. 4B is a timing diagram of various signals, including signals CLKIN, CLKP, CLKN, CLKφ3, and CLKφ4, in the clock generation circuit 400 in FIG. 4A in accordance with one or more embodiments. Components that are the same or similar to those in FIG. 2B are given the same reference numbers, and detailed description thereof is thus omitted.

In some embodiments, input clock signal CLKIN has a predetermined frequency Freq (not shown). An inverse of the predetermined frequency Freq is a time duration T of a clock cycle period of input clock signal CLKIN.

At time t3, in response to the rising edge of signal CLKP at time t1 and the falling edge of signal CLKN at time t2, two-phase non-overlapping clock generation circuit 410 causes clock signal CLKφ3 to transition from logically high to logically low. Also, at time t4, in response to the rising edge of signal CLKP at time t1 and the falling edge of signal CLKN at time t2, two-phase non-overlapping clock generation circuit 410 causes clock signal CLKφ4 to transition from logically low to logically high.

At time t5, clock signal CLKIN transitions from logically high to logically low. In response to the transition of clock signal CLKIN at time t5, delay circuit 224 causes non-inverted clock signal CLKP to transition from logically high to logically low, and inverter 222 causes inverted clock signal CLKN to transition from logically low to logically high. At time t6, two-phase non-overlapping clock generation circuit 410 then causes clock signal CLKφ4 to transition from logically high to logically low. Also, at time t7, two-phase non-overlapping clock generation circuit 410 then causes clock signal CLKφ3 to transition from logically low to logically high.

At time t8, clock signal CLKIN transitions from logically low to logically high. In response to the transition of clock signal CLKIN at time t8, delay circuit 224 causes non-inverted clock signal CLKP to transition from logically low to logically high, and inverter 222 causes inverted clock signal CLKN to transition from logically high to logically low. At time t9, two-phase non-overlapping clock generation circuit 410 then causes clock signal CLKφ3 to transition from logically high to logically low. Also, at time t10, two-phase non-overlapping clock generation circuit 410 then causes clock signal CLKφ4 to transition from logically low to logically high.

In response to a clock cycle 432 from time t0 to time t8, clock signals CLKφ3 and CLKφ4 form a clock cycle 434 from time t4 to time t10. Clock cycle 432 has a time duration T, and clock cycle 434 has the same time duration T. During the clock cycle 434, clock signals CLKφ3 and CLKφ4 are both logically low from time t6 to t7 and having a duration $T_{L3}$ and are both logically low from time t9 to t10 and having a duration $T_{L4}$. In some embodiments, a difference between duration $T_{L3}$ and duration $T_{L4}$ is usable to measure the symmetry between clock signals CLKφ3 and CLKφ4. In some embodiments, delay circuit 224 is configured to have a predetermined delay $D_P$ sufficient to cause a difference between duration $T_{L3}$ and duration $T_{L4}$ to be less than a predetermined tolerance. In some embodiments, the predetermined tolerance between duration $T_{L3}$ and duration $T_{L4}$ is 1.0% of T, which is the inverse of the predetermined frequency Freq.

Figure 5:
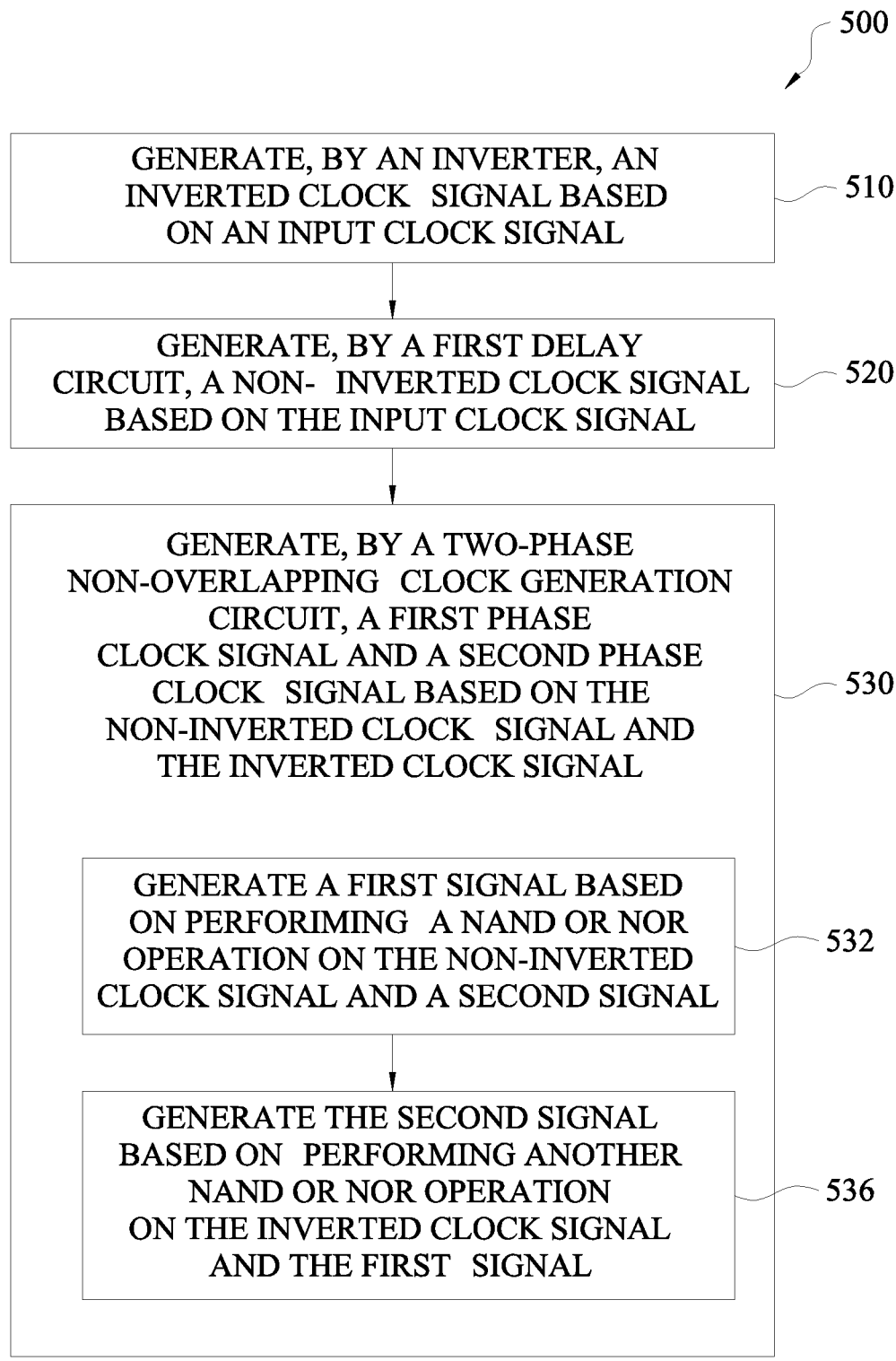
FIG. 5 is a flow chart of a method of operating a clock generation circuit, such as the clock generation circuit depicted in FIG. 2A or FIG. 4A, in accordance with some embodiments.

FIG. 5 is a flow chart of a method 500 of operating a clock generation circuit, such the clock generation circuit depicted in FIG. 2A or FIG. 4A, to generate a pair of two-phase non-overlapping clock signals in accordance with some embodiments. It is understood that additional operations may be performed before, during, and/or after the method 500 depicted in FIG. 5, and that some other processes may only be briefly described herein.

The method 500 begins with operation 510, where an inverted clock signal CLKN is generated by an inverter 222 based on an input clock signal CLKIN. In some embodiments, input clock signal CLKIN has a predetermined frequency Freq.

The method 500 proceeds to operation 520, where a non-inverted clock signal CLKP is generated by a delay circuit 224 based on input clock signal CLKIN. The delay circuit 224 has a predetermined delay $D_P$.

The method 500 proceeds to operation 530, where a first phase clock signal CLKφ1 or CLKφ3 and a second phase clock signal CLKφ2 or CLKφ4 of the pair of two-phase non-overlapping clock signals are generated by a two-phase non-overlapping clock generation circuit 210 or 410. The first phase clock signal CLKφ1 or CLKφ3 and the second phase clock signal CLKφ2 or CLKφ4 correspond to a same logical value during a first duration $T_{L1}$ or $T_{L3}$ and a second duration and $T_{L2}$ or $T_{L4}$ within a clock cycle 234 or 434. The first phase clock signal CLKφ1 or CLKφ3 and the second phase clock signal CLKφ2 or CLKφ4 correspond to different logical values during the remainder of the clock cycle 234 or 434. The clock cycle 234 or 434 has a duration T, which is an inverse of the predetermined frequency Freq.

In some embodiments, the predetermined delay $D_P$ of delay circuit 224 is set to be sufficient to cause a difference between the first duration $T_{L1}$ or $T_{L3}$ and the second duration $T_{L2}$ or $T_{L4}$ to be less than a predetermined tolerance. In some embodiments, the predetermined tolerance is 1.0% of the duration T of the clock cycle 234 or 434.

Operation 530 further includes performing generating a first signal S1 or S3 based on performing a first logical operation on the non-inverted clock signal CLKP and a second signal S2 or S4 (operation 532); and generating the second signal S2 or S4 based on performing a second logical operation on the inverted clock signal CLKN and the first signal S1 or S3. In some embodiments, the first logical operation and the second logical operation are both NAND operations or both NOR operations.

In some embodiments, the generating first signal S1 or S3 is performed by a logical gate 212 or 412 and a delay circuit 214 or 414. In some embodiments, the generating second signal S2 or S4 is performed by a logical gate 213 or 413 and a delay circuit 215 or 415. In some embodiments, logical gate 212 or 412 and logical gate 213 and 413 correspond to a same logical gate configuration. In some embodiments, delay circuit 214 or 414 and delay circuit 215 or 415 correspond to a same delay circuit configuration.

In accordance with one embodiment, a clock generation circuit includes a two-phase non-overlapping clock generation circuit, an inverter, and a delay circuit. The two-phase non-overlapping clock generation circuit is configured to generate a first phase clock signal and a second phase clock signal based on a non-inverted clock signal and an inverted clock signal. The first phase clock signal and the second phase clock signal correspond to a same logical value during a first duration and a second duration within a clock cycle and correspond to different logical values during the remainder of the clock cycle. The inverter is configured to generate the inverted clock signal based on an input clock signal. The delay circuit is configured to generate the non-inverted clock signal based on the input clock signal. The delay circuit has a predetermined delay sufficient to cause a difference between the first duration and the second duration to be less than a predetermined tolerance.

In accordance with another embodiment, a clock generation circuit includes a first logical gate having a first input terminal, a second input terminal, and an output terminal; a second logical gate having a first input terminal, a second input terminal, and an output terminal; a first inverter having an input terminal and an output terminal; a first delay circuit having an input terminal and an output terminal; a second delay circuit having an input terminal and an output terminal; and a third delay circuit having an input terminal and an output terminal. The output terminal of the first inverter is electrically coupled with the first input terminal of the second logical gate. The input terminal of the first delay circuit is electrically coupled with the output terminal of the first logical gate, and the output terminal of the first delay circuit is electrically coupled with the second input terminal of the second logical gate. The input terminal of the second delay circuit is electrically coupled with the output terminal of the second logical gate, and the output terminal of the second delay circuit is electrically coupled with the second input terminal of the first logical gate. The input terminal of the third delay circuit is electrically coupled with the input terminal of the first inverter, and the output terminal of the third delay circuit is electrically coupled with the first input terminal of the first logical gate. The first inverter is configured to cause a phase-inverted delay between the output terminal of the first inverter and the input terminal of the first inverter. The third delay circuit is configured to cause a non-phase-inverted delay between the output terminal of the third delay circuit and the input terminal of the third delay circuit. A difference between the phase-inverted delay and the non-phase-inverted delay is within a predetermined tolerance.

In accordance with another embodiment, a method of generating a first phase clock signal and a second phase clock signal. The method includes generating, by an inverter, an inverted clock signal based on an input clock signal, the input clock signal having a predetermined frequency. A non-inverted clock signal is generated by a first delay circuit based on the input clock signal. The first delay circuit has a predetermined delay. The first phase clock signal and the second phase clock signal are generated by a two-phase non-overlapping clock generation circuit based on the non-inverted clock signal and the inverted clock signal. The first phase clock signal and the second phase clock signal correspond to a same logical value during a first duration and a second duration within a clock cycle. The first phase clock signal and the second phase clock signal correspond to different logical values during the remainder of the clock cycle. The clock cycle has a duration of an inverse of the predetermined frequency. The predetermined delay is set to be sufficient to cause a difference between the first duration and the second duration to be less than a predetermined tolerance The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock generation circuit, comprising: a two-phase non-overlapping clock generation circuit configured to generate a first phase clock signal and a second phase clock signal based on a non-inverted clock signal and an inverted clock signal, the first phase clock signal and the second phase clock signal corresponding to a same logical value during a first duration and a second duration within a clock cycle and corresponding to different logical values during the remainder of the clock cycle;
   an inverter configured to generate the inverted clock signal based on an input clock signal, the inverter including:
   a first P-type transistor having a first channel width versus channel length (W/L) ratio; and a first N-type transistor having a second W/L ratio;
   the N-type transistor being electrically coupled in series with the first P-type transistor, gates of the first P-type transistor and the first N-type transistor being electrically coupled with an input terminal of the inverter, and drains of the first P-type transistor and the first N-type transistor being electrically coupled with an output terminal of the inverter; and
   a delay circuit configured to generate the non-inverted clock signal based on the input clock signal, the delay circuit having a predetermined delay sufficient to cause a difference between the first duration and the second duration to be less than a predetermined tolerance, the delay circuit including:
   a second P-type transistor having a third W/L ratio; and a second N-type transistor having a fourth W/L ratio;
   the second P-type transistor and the second N-type transistor being electrically coupled in parallel between an input terminal of the delay circuit and an output terminal of the delay circuit;
   wherein at least one of the following conditions is true:
   the third W/L ratio is less than the first W/L ratio; or
   the fourth W/L ratio is less than the second W/L ratio.

2. The clock generation circuit of claim 1, wherein
   the input clock signal has a predetermined frequency;
   the clock cycle has a duration of an inverse of the predetermined frequency; and
   the predetermined tolerance is 1.0% of the duration of the clock cycle.

3. The clock generation circuit of claim 1, wherein both of the following conditions are true:
   the third W/L ratio is less than the first W/L ratio; and
   the fourth W/L ratio is less than the second W/L ratio.

4. The clock generation circuit of claim 3, wherein
   a gate of the second P-type transistor is configured to receive a first signal sufficient to turn on the second P-type transistor; and
   a gate of the second N-type transistor is configured to receive a second signal sufficient to turn on the second N-type transistor.

5. The clock generation circuit of claim 1, wherein
   the delay circuit comprises a plurality of P-type transistors and a plurality of N-type transistors, the plurality of P-type transistors being electrically coupled in series between an input terminal of the delay circuit and an output terminal of the delay circuit, and the plurality of N-type transistors being electrically coupled in series between the input terminal of the delay circuit and the output terminal of the delay circuit.

6. The clock generation circuit of claim 5, wherein
   gates of the plurality of P-type transistors are configured to receive a first signal sufficient to turn on the plurality of P-type transistors; and
   gates of the plurality of N-type transistors are configured to receive a second signal sufficient to turn on the plurality of N-type transistors.

7. The clock generation circuit of claim 1, wherein
   the delay circuit comprises a resistance-capacitance delay circuit.

8. A clock generation circuit, comprising:
   a first logical gate having a first input terminal, a second input terminal, and an output terminal;
   a second logical gate having a first input terminal, a second input terminal, and an output terminal;
   a first inverter having an input terminal and an output terminal, the output terminal of the first inverter being electrically coupled with the first input terminal of the second logical gate, the first inverter including:
   a first P-type transistor having a first channel width versus channel length (W/L) ratio; and
   a first N-type transistor having a second W/L ratio;
   the N-type transistor being electrically coupled in series with the first P-type transistor, gates of the first P-type transistor and the first N-type transistor being electrically coupled with an input terminal of the first inverter, and drains of the first P-type transistor and the first N-type transistor being electrically coupled with an output terminal of the first inverter;
   a first delay circuit having an input terminal and an output terminal, the input terminal of the first delay circuit being electrically coupled with the output terminal of the first logical gate, and the output terminal of the first delay circuit being electrically coupled with the second input terminal of the second logical gate;
   a second delay circuit having an input terminal and an output terminal, the input terminal of the second delay circuit being electrically coupled with the output terminal of the second logical gate, and the output terminal of the second delay circuit being electrically coupled with the second input terminal of the first logical gate; and
   a third delay circuit having an input terminal and an output terminal, the input terminal of the third delay circuit being electrically coupled with the input terminal of the first inverter, and the output terminal of the third delay circuit being electrically coupled with the first input terminal of the first logical gate, the third delay circuit including:
   a second P-type transistor having a third W/L ratio;
   and a second N-type transistor having a fourth W/L ratio;
   the second P-type transistor and the second N-type transistor being electrically coupled in parallel between an input terminal of the third delay circuit and an output terminal of the third delay circuit; wherein the first inverter is configured to cause a phase-inverted delay between the output terminal of the first inverter and the input terminal of the first inverter;

the third delay circuit is configured to cause a non-phase-inverted delay between the output terminal of the third delay circuit and the input terminal of the third delay circuit;

a difference between the phase-inverted delay and the non-phase-inverted delay is within a predetermined tolerance; and at least one of the following conditions is true:

the third W/L ratio is less than the first W/L ratio; or the fourth W/L ratio is less than the second W/L ratio.

9. The clock generation circuit of claim 8, wherein the predetermined tolerance is 1.0% of an inverse of a predetermined frequency.

10. The clock generation circuit of claim 8, further comprising one of the following conditions:

the first logical gate and the second logical gate being NAND gates; or the first logical gate and the second logical gate being NOR gates.

11. The clock generation circuit of claim 8, wherein the first delay circuit comprises 2N inverters electrically coupled in series, N being a positive, non-zero integer; and the second delay circuit comprises another 2N inverters electrically coupled in series.

12. The clock generation circuit of claim 8, wherein both of the following conditions are true:

the a third W/L ratio is less than the first W/L ratio; and the fourth W/L ratio is less than the second W/L ratio.

13. The clock generation circuit of claim 12, wherein a gate of the second P-type transistor is configured to receive a first signal sufficient to turn on the second P-type transistor; and a gate of the second N-type transistor is configured to receive a second signal sufficient to turn on the second N-type transistor.

14. The clock generation circuit of claim 8, wherein the third delay circuit comprises a plurality of P-type transistors and a plurality of N-type transistors, the plurality of P-type transistors being electrically coupled in series between the input terminal of the third delay circuit and the output terminal of the third delay circuit, and the plurality of N-type transistors being electrically coupled in series between the input terminal of the third delay circuit and the output terminal of the third delay circuit.

15. The clock generation circuit of claim 14, wherein gates of the plurality of P-type transistors are configured to receive a first signal sufficient to turn on the plurality of P-type transistors; and gates of the plurality of N-type transistors are configured to receive a second signal sufficient to turn on the plurality of N-type transistors.

16. The clock generation circuit of claim 8, wherein the third delay circuit comprises a resistance-capacitance delay circuit.

17. A method of generating a first phase clock signal and a second phase clock signal, the method comprising:

generating, by an inverter, an inverted clock signal based on an input clock signal, the input clock signal having a predetermined frequency, the inverter having a first predetermined delay (DN), the inverter including:

a first P-type transistor having a first channel width versus channel length (W/L) ratio; and a first N-type transistor having a second W/L ratio;

the N-type transistor being electrically coupled in series with the first P-type transistor, gates of the first P-type transistor and the first N-type transistor being electrically coupled with an input terminal of the inverter, and drains of the first P-type transistor and the first N-type transistor being electrically coupled with an output terminal of the inverter;

the first predetermined delay being based on the first and second W/L ratios; generating, by a first delay circuit, a non-inverted clock signal based on the input clock signal, the first delay circuit having a second predetermined delay (Dp), the first delay circuit including:

a second P-type transistor having a third W/L ratio;

and a second N-type transistor having a fourth W/L ratio;

the second P-type transistor and the second N-type transistor being electrically coupled in parallel between an input terminal of the first delay circuit and an output terminal of the first delay circuit;

the second predetermined delay being based on the third and fourth W/L ratios; and generating, by a two-phase non-overlapping clock generation circuit, the first phase clock signal and the second phase clock signal based on the non-inverted clock signal and the inverted clock signal, wherein the first phase clock signal and the second phase clock signal correspond to a same logical value during a first duration and a second duration within a clock cycle;

the first phase clock signal and the second phase clock signal correspond to different logical values during the remainder of the clock cycle;

the clock cycle has a duration of an inverse of the predetermined frequency;

the second predetermined delay is set to be sufficient to cause a difference between the first duration and the second duration to be less than a predetermined tolerance; and the first predetermined delay and the second predetermined delay are related on the basis of at least one of the following conditions being true;

the third W/L ratio is less than the first W/L ratio; or the fourth W/L ratio is less than the second W/L ratio.

18. The method of claim 17, wherein the predetermined tolerance is 1.0% of the duration of the clock cycle.

19. The method of claim 17, wherein the generating the first phase clock signal and the second phase clock signal comprises:

generating a first signal based on performing a first logical operation on the non-inverted clock signal and a second signal; and generating the second signal based on performing a second logical operation on the inverted clock signal and the first signal, the first logical operation and the second logical operation being both NAND operations or both NOR operations.

20. The method of claim 19, wherein the generating a first signal is performed by a first logical gate and a second delay circuit;

the generating a second signal is performed by a second logical gate and a third delay circuit;

the first logical gate and the second logical gate correspond to a same logical gate configuration; and the second delay circuit and the third delay circuit correspond to a same delay circuit configuration.

* * * * *